United States Patent
Park et al.

(10) Patent No.: US 9,035,294 B2
(45) Date of Patent: May 19, 2015

(54) TRANSISTORS, METHODS OF MANUFACTURING THE SAME, AND ELECTRONIC DEVICES INCLUDING TRANSISTORS

(75) Inventors: Joon-seok Park, Seongnam-si (KR); Tae-sang Kim, Seoul (KR); Hyun-suk Kim, Hwaseong-si (KR); Myung-kwan Ryu, Yongin-si (KR); Jong-baek Seon, Yongin-si (KR); Kyoung-seok Son, Seoul (KR); Sang-yoon Lee, Seoul (KR); Seok-jun Seo, Suncheon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 179 days.

(21) Appl. No.: 13/550,752

(22) Filed: Jul. 17, 2012

(65) Prior Publication Data

US 2013/0140551 A1 Jun. 6, 2013

(30) Foreign Application Priority Data

Dec. 6, 2011 (KR) ........................ 10 2011 0129910

(51) Int. Cl.
| | |
|---|---|
| H01L 29/10 | (2006.01) |
| B32B 3/26 | (2006.01) |
| H01L 29/786 | (2006.01) |
| H01L 29/49 | (2006.01) |

(52) U.S. Cl.
CPC ........... *B32B 3/26* (2013.01); *Y10T 428/24479* (2015.01); *H01L 29/4908* (2013.01); *H01L 29/786* (2013.01); *H01L 29/7869* (2013.01)

(58) Field of Classification Search
USPC .............................................. 257/43; 438/106
See application file for complete search history.

(56) References Cited

U.S. PATENT DOCUMENTS

| 5,458,753 | A | * | 10/1995 | Sato et al. ................. 204/192.29 |
| 2010/0140611 | A1 | * | 6/2010 | Itagaki et al. .................... 257/43 |
| 2010/0301343 | A1 | | 12/2010 | Qiu et al. |
| 2011/0168994 | A1 | * | 7/2011 | Kawashima et al. ........... 257/43 |
| 2012/0132904 | A1 | * | 5/2012 | Yamazaki ........................ 257/43 |

FOREIGN PATENT DOCUMENTS

| KR | 10-2010-0010978 A | 2/2010 |
| WO | WO-2010/002807 A2 | 1/2010 |
| WO | WO-2010/021349 A1 | 2/2010 |

OTHER PUBLICATIONS

Ye, Y. et al., "High Mobility Amorphous Zinc Oxynitride Semiconductor Material for Thin Film Transistors", Journal of Applied Physics, 2009, vol. 106, published by American Institute of Physics.

* cited by examiner

*Primary Examiner* — David Vu
*Assistant Examiner* — Brandon Fox
(74) *Attorney, Agent, or Firm* — Harness, Dickey & Pierce

(57) ABSTRACT

A transistor may include a channel layer formed of an oxide semiconductor. The oxide semiconductor may include GaZnON, and a proportion of Ga content to a total content of Ga and Zn of the channel layer is about 0.5 to about 4.5 at %.

28 Claims, 7 Drawing Sheets

TRANSISTORS, METHODS OF MANUFACTURING THE SAME, AND ELECTRONIC DEVICES INCLUDING TRANSISTORS

CROSS-REFERENCE TO RELATED APPLICATIONS

This application claims the benefit of Korean Patent Application No. 10-2011-0129910, filed on Dec. 6, 2011, in the Korean Intellectual Property Office, the disclosure of which is incorporated herein in its entirety by reference.

BACKGROUND

1. Field

Some example embodiments relate to transistors, methods of manufacturing the same, and/or electronic devices including the transistors.

2. Description of the Related Art

Transistors are widely used in electronic devices as switching devices or driving devices. In particular, since thin film transistors may be formed on glass substrates or plastic substrates, they are generally used in the field of flat panel display apparatuses, such as liquid crystal display devices, organic light-emitting display devices, or the like.

A method of using an oxide layer having a higher carrier mobility as a channel layer attempts to improve operating characteristics of a transistor. This method is mostly applied to a thin film transistor for a flat panel display apparatus.

However, characteristics of a transistor having an oxide layer as a channel layer may not be constantly maintained since the oxide layer is sensitive to light.

SUMMARY

Some example embodiments provide transistors having higher reliability, higher performance, and/or have characteristics that are prevented/suppressed from being changed due to light. Some example embodiments also provide methods of manufacturing the transistors. Some example embodiments provide electronic devices (e.g., flat display apparatuses) including the transistors.

Additional aspects will be set forth in part in the description which follows and, in part, will be apparent from the description, or may be learned by practice of example embodiments.

According to an example embodiment, a transistor includes a channel layer including GaZnON, a source and a drain configured to contact first and second regions of the channel layer, respectively, a gate corresponding to the channel layer, and a gate insulating layer between the channel layer and the gate. A proportion of Ga content to a total content of Ga and Zn of the channel layer may be about 0.5 to about 4.5 at %.

The proportion of the Ga content to the total content of Ga and Zn of the channel layer may be about 1 to about 3 at %. The Ga content of the channel layer may be about 0.25 to about 2.25 at %. The Ga content of the channel layer may be about 0.5 to about 1.5 at %. The channel layer may have a thickness of about 10 to about 150 nm. The channel layer may be on the gate. An etch stop layer may be on the channel layer. The gate may be on the channel layer.

According to another example embodiment, a flat display apparatus includes the transistor.

According to another example embodiment, a method of manufacturing a transistor includes forming a gate, forming a channel layer corresponding to the gate, the channel layer including GaZnON, and forming a source and a drain contacting first and second regions of the channel layer, respectively. The channel layer is formed such that a proportion of Ga content to a total content of Ga and Zn is about 0.5 to about 4.5 at %.

The channel layer may be formed to have a proportion of Ga content to the total content of Ga and Zn of the GaZnON layer of about 1 to about 3 at %. The channel layer may be formed by a reactive sputtering method. The channel layer may be formed using a $Ga_2O_3$ target and a Zn target. The channel layer may be formed using $O_2$ gas and $N_2$ gas as a reaction gas in the reactive sputtering method.

The channel layer may be formed by supplying the $O_2$ gas at a flow rate of about 1 to about 15 sccm, and the $N_2$ gas has a flow rate of about 20 to about 150 sccm. The channel layer may be formed using argon (Ar) gas for generating plasma. The channel layer may be formed using the Ar gas has a flow rate of about 1 to about 50 sccm.

The channel layer may be formed by a reactive sputtering method at a temperature from room temperature to about 100° C. The channel layer may be formed by a metal organic chemical vapor deposition (MOCVD) method. The transistor may be annealed at a temperature of about 250 to about 350° C. The gate may be formed on the channel layer, and the channel layer may be formed on the gate. An etch stop layer may be formed on the channel layer.

According to another example embodiment, a channel layer includes GaZnON, and a proportion of Ga content to a total content of Ga and Zn of the channel layer is about 0.5 to about 4.5 at %.

The proportion of the Ga content to the total content of Ga and Zn of the channel layer may be about 1 to about 3 at %. The Ga content may be about 0.25 to about 2.25 at %. The Ga content may be about 0.5 to about 1.5 at %. The channel layer may have a thickness of about 10 to about 150 nm.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
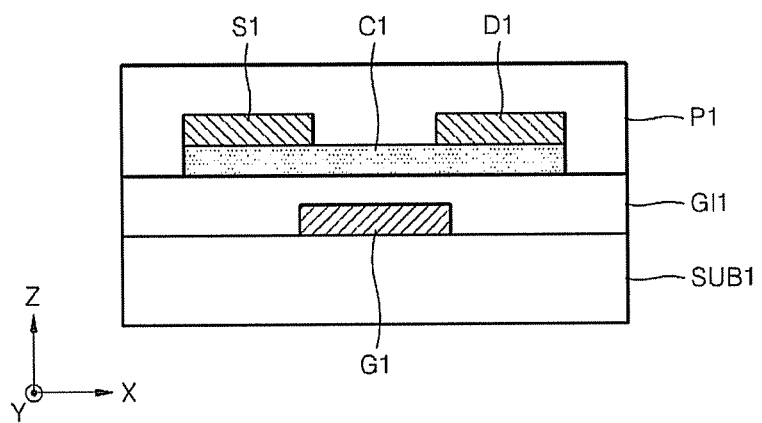
FIGS. 1 through 5 are cross-sectional views of transistors according to some example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, transistors, methods of manufacturing the transistors, and electronic devices including the transistors are described with regard to example embodiments with reference to the attached drawings. In the drawings, the thicknesses of layers and regions are exaggerated for clarity. Like reference numerals in the drawings denote like elements.

FIG. 1 is a cross-sectional view of a transistor according to an example embodiment. The transistor according to the present embodiment is a bottom gate-type transistor in which a gate G1 is disposed below a channel layer C1.

Referring to FIG. 1, the gate G1 may be disposed on a substrate SUB1. The substrate SUB1 may be a glass substrate or may be any substrate used to manufacture a semiconductor device, such as a plastic substrate, a silicon substrate, or the like. The gate G1 may be formed of a general electrode material (e.g., a metal, a conductive oxide, or the like). A gate insulating layer GI1 may be disposed on the substrate SUB1 so as to cover the gate G1. The gate insulating layer GI1 may include a silicon oxide layer, a silicon oxynitride layer, or a silicon nitride layer, or may include another material layer such as a high-k dielectric material layer having a higher dielectric constant than the silicon nitride layer. The gate insulating layer GI1 may include a stack including at least two selected from the silicon oxide layer, the silicon oxynitride layer, the silicon nitride layer, and the high-k dielectric material layer.

The channel layer C1 may be disposed on the gate insulating layer GI1. The channel layer C1 may be disposed above the gate G1. A width of the channel layer C1, which is measured along an X-axis direction, may be greater than a width of the gate G1, which is measured along the X-axis direction, but if necessary, the width of the channel layer C1 may be similar to or smaller than the width of the gate G1. The channel layer C1 may include an oxide semiconductor. The oxide semiconductor may be an oxynitride semiconductor. For example, the channel layer C1 may include a ZnON-based semiconductor. In detail, for example, the channel layer C1 may include GaZnON. The GaZnON may be "Ga-containing ZnON" or "ZnON doped with Ga". When the channel layer C1 includes GaZnON, the proportion of Ga content to the total content of Ga and Zn of the channel layer C1 may be from about 0.5 to about 4.5 at %.

For example, the proportion of Ga content to the total content of Ga and Zn of the channel layer C1 may be from about 1 to about 3 at %. The proportion of Ga content to the total content of Ga and Zn may be calculated according to Formula: {Ga content/(Ga content+Zn content)}×100. The Ga content of the channel layer C1 may be from about 0.25 to about 2.25 at %. For example, the Ga content of the channel layer C1 may be from about 0.5 to about 1.5 at %. When the Ga content of the channel layer C1 is from about 0.25 to about 2.25 at %, the proportion of Ga content to the total content of Ga and Zn may be from about 0.5 to about 4.5 at %. When the Ga content of the channel layer C1 is from about 0.5 to about 1.5 at %, the proportion of Ga content to the total content of Ga and Zn may be from about 1 to about 3 at %.

When the proportion of Ga content to the total content of Ga and Zn satisfies the above-described condition (that is, 0.5 to 4.5 at % or 1 to 3 at %), a transistor having high reliability and high performance may be obtained, as described below with reference to FIG. 6. The oxide semiconductor (e.g., GaZnON) of the channel layer C1 may be amorphous or crystalline, or may have a mixture structure of amorphous and crystalline phases. The thickness of the channel layer C1 may be from about 10 to about 150 nm, for example, from about 50 to about 100 nm. However, if necessary, a thickness range of the channel layer C1 may be changed.

A source electrode S1 and a drain electrode D1 may be disposed on the channel layer C1 so as to contact first and second regions of the channel layer C1, respectively. The source electrode S1 may contact one end of the channel layer C1 and the drain electrode D1 may contact the other end of the channel layer C1. The source electrode S1 and the drain electrode D1 may each be the same material layer as the gate G1 or may each be a different material layer from the gate G1. The source electrode S1 and the drain electrode D1 may each include a single layer or a plurality of layers.

The shapes and positions of the source electrode S1 and the drain electrode D1 may be changed. For example, the source electrode S1 may extend on one end of the channel layer C1 over a region of the gate insulating layer GI1, which is adjacent thereto. Similarly, the drain electrode D1 may extend on the other end of the channel layer C1 over a region of the gate insulating layer GI1, which is adjacent thereto. Alternatively, the source electrode S1 and the drain electrode D1 may contact two regions other than both ends of the channel layer C1.

A passivation layer P1 may be disposed on the gate insulating layer GI1 so as to cover the channel layer C1, the source electrode S1, and the drain electrode D1. The passivation layer P1 may include, for example, a silicon oxide layer, a silicon oxynitride layer, a silicon nitride layer, or an organic insulating layer, or alternatively, may have a stack structure including at least two layers thereof.

The gate G1, the gate insulating layer GI1, the source electrode S1, the drain electrode D1, and the passivation layer P1 may have a thickness from about 50 to about 300 nm, a thickness from about 50 to about 400 nm, a thickness from about 10 to about 200 nm, a thickness from about 10 to about 200 nm, and a thickness from about 50 to about 1200 nm, respectively. However, the thicknesses may be changed, if necessary.

Figure 2:
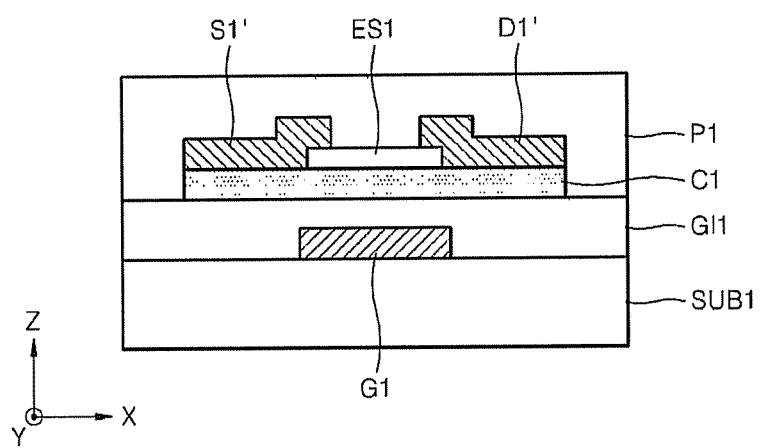

According to another example embodiment, the transistor of FIG. 1 may further include an etch stop layer disposed on the channel layer C1, as shown in FIG. 2.

Referring to FIG. 2, an etch stop layer ES1 may be further disposed on the channel layer C1. A width of the etch stop layer ES1, which is measured along an X-axis direction, may be less than that of the channel layer C1. The two ends of the channel layer C1 may not be covered by the etch stop layer ES1. A source electrode S1' may cover one end of the channel layer C1 and a region of the etch stop layer ES1, which is adjacent thereto, and a drain electrode D1' may cover the other end of the channel layer C1 and a region of the etch stop layer ES1, which is adjacent thereto.

The etch stop layer ES1 may prevent or suppress damage to the channel layer C1 during an etching operation for forming the source electrode S1' and the drain electrode D1'. The etch stop layer ES1 may include, for example, a silicon oxide, a silicon nitride, an organic insulation material, or the like. The etch stop layer ES1 may be used based on a material of the channel layer C1 and materials of the source electrode S1' and the drain electrode D1'. The transistor of FIG. 2 may have the same structure as in FIG. 1, except that the transistor of FIG. 2 includes the etch stop layer ES1 and the shapes of the source electrode S1' and the drain electrode D1' are slightly modified.

Figure 3:
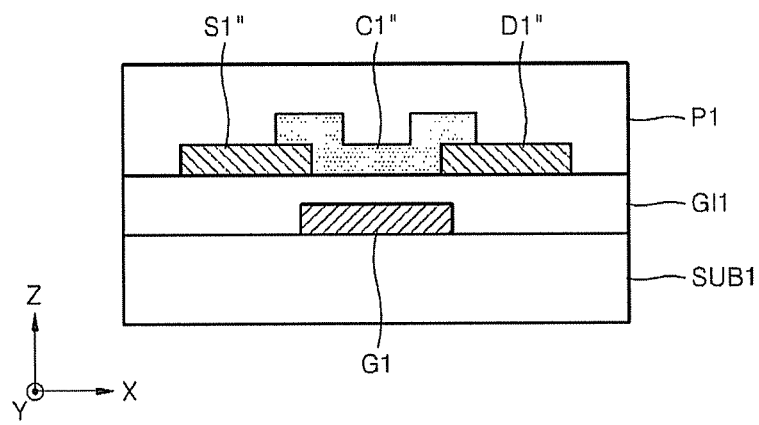

In FIG. 1, the source electrode S1 and the drain electrode D1 are disposed on two regions of an upper surface of the channel layer C1, but their positional relationship may be changed, an example of which is shown in FIG. 3.

Referring to FIG. 3, a source electrode S1" and a drain electrode D1" that are spaced apart from each other may be disposed on the gate insulating layer GI1. A channel layer C1" may be disposed on the gate insulating layer GI1 between the source electrode S1" and the drain electrode D1" so as to contact the source electrode S1" and the drain electrode D1". Thus, the source electrode S1" and the drain electrode D1" may contact two ends of a lower surface of the channel layer C1". The channel layer C1" may be formed of the same or similar material as the channel layer C1 of FIG. 1.

For example, the channel layer C1" may include GaZnON. In this case, the proportion of Ga content to the total content of Ga and Zn may be about 0.5 to about 4.5 at %, for example, about 1 to about 3 at %. The transistor of FIG. 3 may have the same structure as in FIG. 1, except for the positional relationship and shapes of the channel layer C1", the source electrode S1" and the drain electrode D1".

Figure 4:
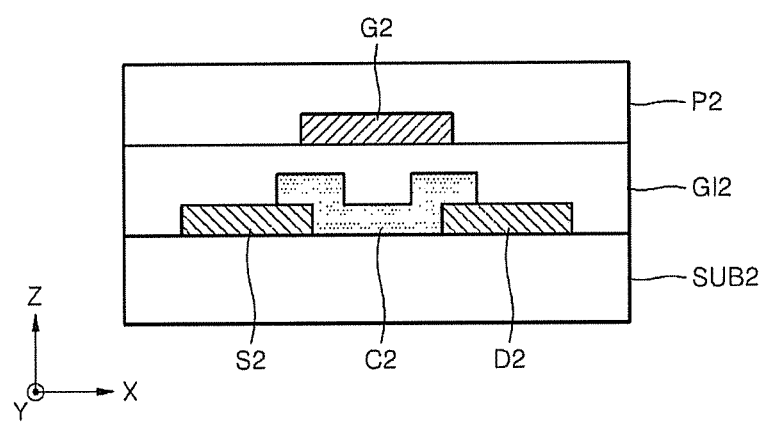

FIG. 4 is a cross-sectional view of a transistor according to another example embodiment. The transistor according to the present embodiment is a top gate-type transistor in which a gate G2 is disposed above a channel layer C2.

Referring to FIG. 4, a source electrode S2 and a drain electrode D2 that are spaced apart from each other may be disposed on a substrate SUB2. The channel layer C2 may be disposed on the substrate SUB2 between the source electrode S2 and the drain electrode D2 so as to contact the source electrode S2 and the drain electrode D2. The channel layer C2 may be formed of the same or similar material as the channel layer C1 of FIG. 1. For example, the channel layer C2 may include GaZnON.

In this case, the proportion of Ga content to the total content of Ga and Zn may be about 0.5 to about 4.5 at %, for example, about 1 to about 3 at %. A gate insulating layer G12 may be disposed on the substrate SUB2 so as to cover the channel layer C2, the source electrode S2, and the drain electrode D2. The gate G2 may be disposed on the gate insulating layer G12. The gate G2 may be disposed above the channel layer C2. A passivation layer P2 may be disposed on the gate insulating layer G12 so as to cover the gate G2.

The materials, thickness, and the like of the substrate SUB2, the source electrode S2, the drain electrode D2, the channel layer C2, the gate insulating layer G12, the gate G2, and the passivation layer P2 of FIG. 4 may be the same or similar as those of the substrate SUB1, the source electrode S1, the drain electrode D1, the channel layer C1, the gate insulating layer GI1, the gate G1, and the passivation layer P1 of FIG. 1, respectively.

Figure 5:
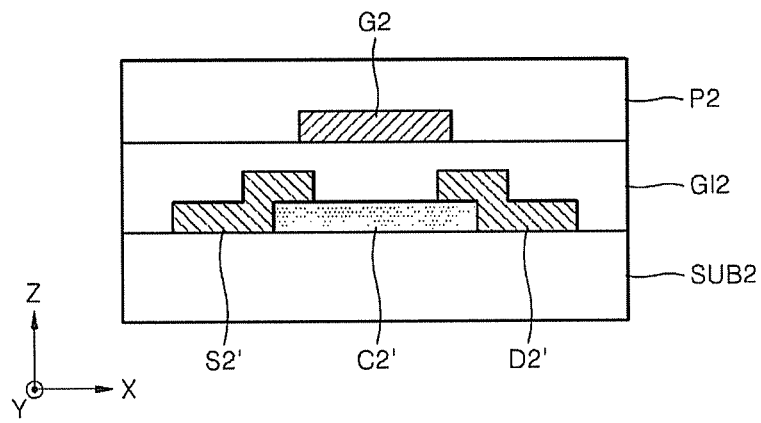

The positional relationship of the channel layer C2, and the source electrode S2 and the drain electrode D2 of FIG. 4 may be changed, an example of which is shown in FIG. 5.

Referring to FIG. 5, a channel layer C2' may be disposed on the substrate SUB2. The channel layer C2' may include GaZnON. In this case, the proportion of Ga content to the total content of Ga and Zn may be about 0.5 to about 4.5 at %, for example, about 1 to about 3 at %. A source electrode S2' and a drain electrode D2' may be disposed so as to contact first and second regions of the channel layer C2', respectively. The source electrode S2' may contact one end of the channel layer C2' and may extend over a region of the substrate SUB2, which is adjacent thereto.

The drain electrode D2' may contact the other end of the channel layer C2' and may extend over a region of the substrate SUB2, which is adjacent thereto. The gate insulating layer G12 may be disposed on the substrate SUB2 so as to cover the channel layer C2', the source electrode S2', and the drain electrode D2'. The gate G2 and the passivation layer P2 covering the gate G2 may be disposed on the gate insulating layer G12. The transistor of FIG. 5 may have the same structure as in FIG. 4, except for the positional relationship and shapes of the channel layer C2', the source electrode S2', and the drain electrode D2'.

Figure 6:
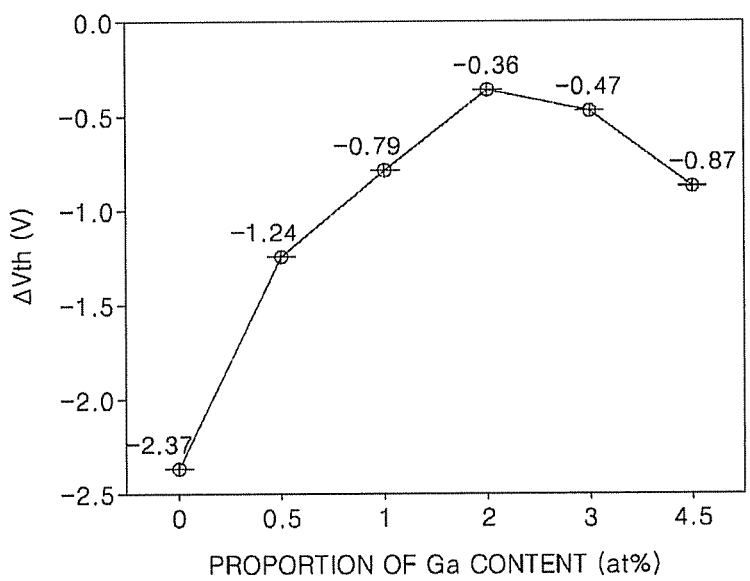
FIG. 6 is a graph showing the result of evaluating the photoelectric reliability of a transistor according to a composition ratio of a channel layer, according to an example embodiment.

FIG. 6 is a graph showing the result of evaluating the photoelectric reliability of a transistor according to a composition ratio of a channel layer, according to an example embodiment. In more detail, FIG. 6 shows a result of measurement of a threshold voltage variation ΔVth of a transistor due to a negative bias illumination temperature stress (NBITS) according to a change in the proportion of Ga content of a channel layer (that is, a GaZnON layer). The proportion of Ga content refers to the proportion of Ga content to the total content of Ga and Zn, that is, {Ga content/(Ga content+Zn content)}×100. A given (or alternatively, predetermined) NBITS was applied to transistors including channel layers having Ga proportions of 0 at %, 0.5 at %, 1 at %, 2 at %, 3 at %, and 4.5 at % and then changes in threshold voltages Vth of the transistors were measured. Conditions related to the NBITS are shown in Table 1 below. Threshold voltage changes of the transistors between before and after the application of NBITSs having the following conditions were measured.

TABLE 1

| Division | Condition |
| --- | --- |
| Irradiated light | Blue light, 168 lux |
| Voltage | Gate: −20 V |
| | Drain electrode: +10 V |
| | Source electrode: 0 V |
| Temperature | 60° C. |
| Time | 3 h |

Referring to FIG. 6, when the proportion of Ga content is about 0.5 to about 4.5 at %, the threshold voltage variation ΔVth may be from about −1.24 V to about −0.36V, which is relatively low. In particular, when the proportion of Ga content is about 1 to about 3 at %, the threshold voltage variation ΔVth may be from about −0.79 V to about −0.36 V, which is relatively low. It may be confirmed that, when the proportion of Ga content of the channel layer (that is, a GaZnON layer), that is, the proportion of Ga content to the total content of Ga and Zn is about 0.5 to about 4.5 at %, in particular, about 1 to 3 at %, the transistor may have desirable photoelectric reliability. When a transistor has a proportion of Ga content of 2 at %, the threshold voltage variation ΔVth is −0.36V, which is the lowest. Thus, when the proportion of Ga content is about 1.5 to about 2.5 at %, in particular, about 2 at %, the transistor may have desirable photoelectric reliability.

When the proportion of Ga content is 0 at %, that is, when a channel layer (that is, a ZnON layer) without Ga is used, the threshold voltage variation ΔVth is −2.37 V, which is relatively high. When a channel layer (that is, a ZnON layer) without Ga is used, a change in properties of a transistor due to a photoelectric stress is higher. In addition, when the proportion of Ga content is increased to 5 at % or more, the threshold voltage variation ΔVth of a transistor may be increased. Thus, when the proportion of Ga content to Zn content of a channel layer (that is, a GaZnON layer) falls within an optimal range, desirable photoelectric reliability may be ensured. According to the present embodiment, the proportion of Ga content of the channel layer (that is, a GaZnON layer), that is, the proportion of Ga content to the total content of Ga and Zn may be about 0.5 to about 4.5 at %, for example, about 1 to about 3 at %, thereby obtaining a transistor having desirable reliability.

The mobility of a transistor using a channel layer (that is, a GaZnON layer) having the proportion of Ga content of about 0.5 to about 4.5 at % is about 25 to about 60 cm$^2$/Vs, which is relatively high. In detail, the mobility of a transistor having the proportion of Ga content of 0.5 at % is about 57.9 cm$^2$/Vs, the mobility of a transistor having the proportion of Ga content of 1 at % is about 52.7 cm$^2$/Vs, the mobility of a transistor having the proportion of Ga content of 2 at % is about 44.6 cm$^2$/Vs, and the mobility of a transistor having the proportion of Ga content of 3 at % is about 34.4 cm$^2$/Vs. When the mobility of a transistor is about 25 cm$^2$/Vs or more, since the transistor is appropriately used in a high-driving and high-resolution display apparatus, a transistor according to example embodiments may be more easily used in a high-speed and high-performance electronic device.

As described above, according to example embodiments, a transistor having higher reliability as well as higher performance may be provided. In particular, a high-reliability/high-performance transistor having characteristics that are prevented/suppressed from being changed due to light, as well as higher mobility, may be provided. Although a transistor (a conventional oxide transistor) using a conventional oxide semiconductor (e.g., In-containing oxide semiconductor) as a channel layer has relatively high mobility, a change in characteristics of the transistor due to light may be large, and thus, related problems may be occurred.

It is assumed that this is because oxygen vacancy and defects in the oxide semiconductor (channel layer) serve as a carrier or a trap, thereby increasing photocurrent. Meanwhile, a transistor using a channel formed of pure ZnO has a mobility of 1 cm$^2$/Vs or less, which is relatively low. However, according to example embodiments, since ZnON containing an appropriate content of Ga is used as a material for forming a channel layer, the amount of carriers and traps in the channel layer may be adjusted, and thus, a transistor having higher reliability and higher performance may be obtained.

Figure 7:
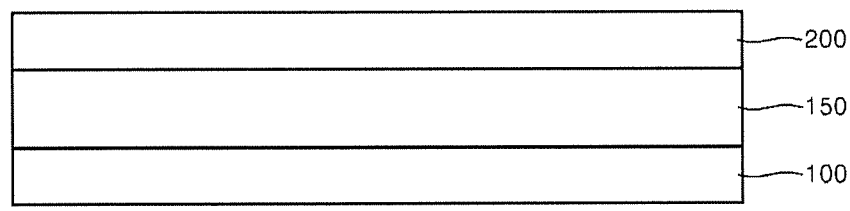
FIG. 7 is a cross-sectional view of an electronic device (flat display apparatus) according to an example embodiment.

A transistor according to example embodiments may be used as switching devices or driving devices in a flat display apparatus, such as a liquid crystal display apparatus and an organic light-emitting display apparatus. As described above, since the transistor has a relatively small change in characteristics due to light and desirable performance, if the transistor is used in a flat display apparatus, the reliability and performance of the flat display apparatus may be increased. The transistor may be used in other electronic devices such as memory devices and logic devices FIG. 7 is a cross-sectional view of an electronic device (flat display apparatus) according to an example embodiment. The electronic device (flat display apparatus) according to the present embodiment is a liquid crystal display device.

Referring to FIG. 7, a liquid crystal layer 150 may be disposed between a first substrate 100 and a second substrate 200. The first substrate 100 may be an array substrate including at least one of the transistors according to example embodiments, for example, at least one of the transistors of FIGS. 1 through 5 as a switching device or a driving device. The first substrate 100 may include a pixel electrode (not shown) connected to a transistor. The second substrate 200 may include a counter electrode (not shown) corresponding to the pixel electrode.

According to a voltage applied between the first substrate 100 and the second substrate 200, a liquid crystal orientation state of the liquid crystal layer 150 may vary. A structure of the electronic device including the transistor according to the present embodiment may not be limited to the structure shown in FIG. 7 and may differ.

FIGS. 8A through 8E are cross-sectional views of a method of manufacturing a transistor, according to an example embodiment. The method is a method of manufacturing a bottom gate-type thin film transistor.

Figure 8A:
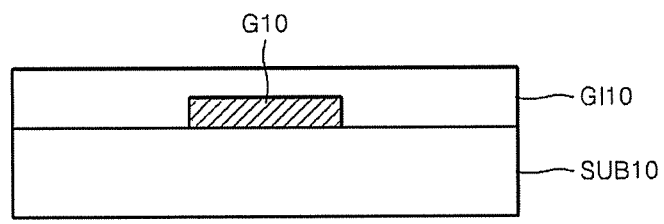
FIGS. 8A through 8E are cross-sectional views of a method of manufacturing a transistor, according to an example embodiment.

Referring to FIG. 8A, a gate G10 may be formed on a substrate SUB10. A gate insulating layer GI10 may be formed on the substrate SUB10 to cover the gate G10. The substrate SUB10 may be a glass substrate or may be any substrate used to manufacture a semiconductor device, such as a plastic substrate, a silicon substrate, or the like. The gate G10 may be formed of a general electrode material (a metal, a conductive oxide, or the like). The gate insulating layer GI10 may include a silicon oxide layer, a silicon oxynitride layer, or a silicon nitride layer, or may include another material layer such as a high-k dielectric material layer having a higher dielectric constant than the silicon nitride layer. The gate insulating layer GI10 may include a stack including at least two selected from the silicon oxide layer, the silicon oxynitride layer, the silicon nitride layer, and the high-k dielectric material layer.

Figure 8B:
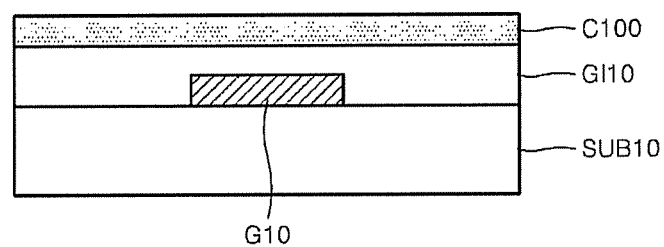

Referring to FIG. 8B, a channel semiconductor layer C100 may be formed on the gate insulating layer GI10. The channel semiconductor layer C100 may be formed of an oxide semiconductor. The oxide semiconductor may be an oxynitride semiconductor. For example, the channel semiconductor layer C100 may include a ZnON-based semiconductor. In detail, the channel semiconductor layer C100 may include GaZnON. In this case, the proportion of Ga content to the total content of Ga and Zn of the channel semiconductor layer C100 may be about 0.5 to about 4.5 at %, for example, about 1 to about 3 at %.

The Ga content of the channel semiconductor layer C100 may be about 0.25 to about 2.25 at %, for example, about 0.5 to about 1.5 at %. The channel semiconductor layer C100 may be amorphous or crystalline, or may have a mixture structure of amorphous and crystalline phases. The thickness of the channel semiconductor layer C100 may be from about 10 to about 150 nm, for example, about 50 to about 100 nm. However, if necessary, a thickness range of the channel semiconductor layer C100 may be changed.

The channel semiconductor layer C100 may be formed by using a physical vapor deposition (PVD) method such as a reactive sputtering method, for example. When the channel semiconductor layer C100 is formed of GaZnON, the reactive sputtering method for forming the channel semiconductor layer C100 may be performed in a co-sputtering manner using a $Ga_2O_3$ target and a Zn target. In this case, the reactive sputtering method may use $O_2$ gas and $N_2$ gas as a reaction gas. In this case, the flow rate of the $O_2$ gas may be about 1 to about 15 sccm and the flow rate of the $N_2$ gas may be about 20 to about 150 sccm. The reactive sputtering method may further use Ar gas in order to generate plasma. In this case, the flow rate of the Ar gas may be about 1 to about 50 sccm.

When plasma is generated by using the Ar gas, deposition efficiency may be increased. The reactive sputtering method may be performed at a temperature from room temperature to about 100° C. and a pressure of about 0.4 to about 0.8 Pa. The method of forming the channel semiconductor layer C100 is just an example and may differ. For example, the channel semiconductor layer C100 may be formed by other methods than the reactive sputtering method, for example, a metal organic chemical vapor deposition (MOCVD) method using a Ga precursor and a Zn precursor. In addition, the channel semiconductor layer C100 may be formed by other methods, for example, a chemical vapor deposition (CVD) method, an atomic layer deposition (ALD) method, or an evaporation method.

Figure 8C:
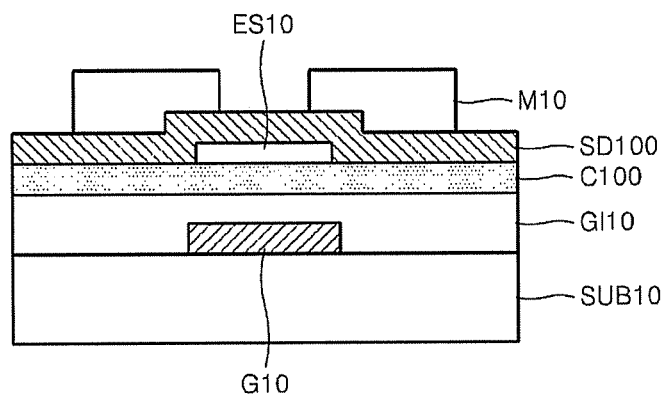

Referring to FIG. 8C, an etch stop layer ES10 may be disposed on the channel semiconductor layer C100. The etch stop layer ES10 may be formed over the gate G10 so as to correspond to the gate G10. The etch stop layer ES10 may include, for example, a silicon oxide, a silicon nitride, an organic insulation material, or the like. A source/drain conductive layer SD100 may be disposed on the gate insulating layer GI10 so as to cover the channel semiconductor layer C100 and the etch stop layer ES10.

The source/drain conductive layer SD100 may be formed of the same material as the gate G10 may each be a different material layer from the gate G10. The source/drain conductive layer SD100 may each include a single layer or a plurality of layers. Then, a given (or alternatively, predetermined) mask pattern M10 may be formed on the source/drain conductive layer SD100. The mask pattern M10 may be formed to define regions where source/drain electrodes are to be formed.

The source/drain conductive layer SD100 and the channel semiconductor layer C100 may be etched (patterned) by using the mask pattern M10 as an etch barrier. The result of the etching (patterning) is shown in FIG. 8D.

Figure 8D:
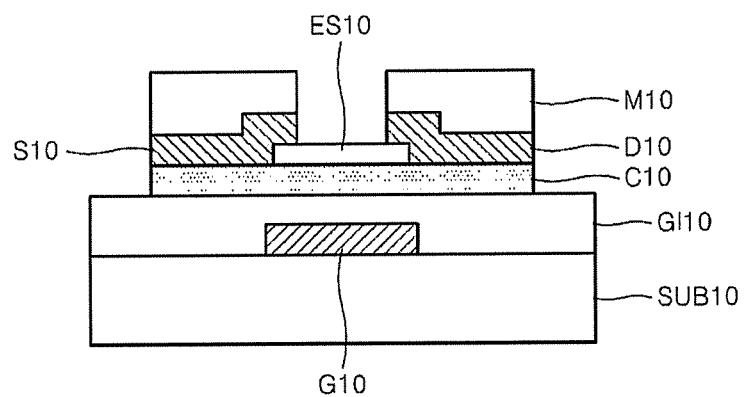

Referring to FIG. 8D, a channel layer C10 may be formed from the channel semiconductor layer C100. A source electrode S10 and a drain electrode D10 may be formed from the source/drain conductive layer SD100. In the etching (patterning), the etch stop layer ES10 may protect a region of the channel layer C10 between the source electrode S10 and the drain electrode D10. However, formation of the etch stop layer ES10 is selectively performed.

Figure 8E:
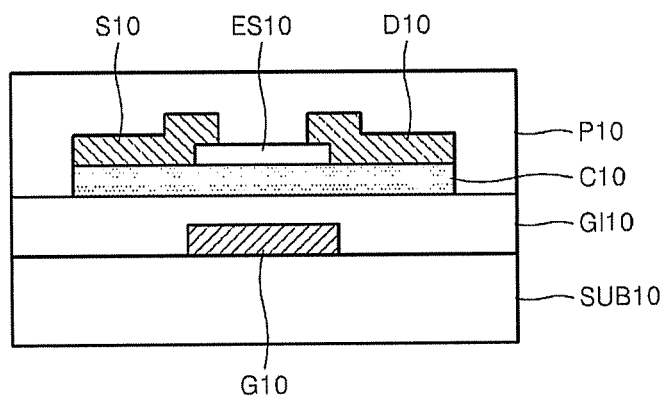

Referring to FIG. 8E, after the mask pattern M10 is removed, a passivation layer P10 may be formed on the gate insulating layer GI10 so as to cover the etch stop layer ES10, the source electrode S10, and the drain electrode D10. The passivation layer P10 may include, for example, a silicon oxide layer, a silicon oxynitride layer, a silicon nitride layer, or an organic insulating layer, or alternatively, may have a stack structure including at least two layers thereof. The transistor manufactured by using the method may be annealed at a given (or alternatively, predetermined) temperature. The annealing may be performed at a temperature of, for example, about 250 to about 350° C.

The method described with reference to FIGS. 8A through 8E is an example of a method of manufacturing the transistor of FIG. 2. The transistors of FIGS. 1 and 3 may be manufactured by using modified methods of the method described with reference to FIGS. 8A through 8E. The methods of manufacturing the transistors of FIGS. 1 and 3 may be known by one of ordinary skill in the art, based on the method described with reference to FIGS. 8A through 8E, and thus, are not described.

Figure 9A:
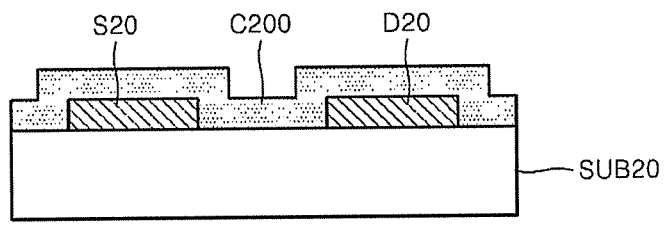
FIGS. 9A through 9C are cross-sectional views of a method of manufacturing a transistor, according to another example embodiment.
Figure 9B:
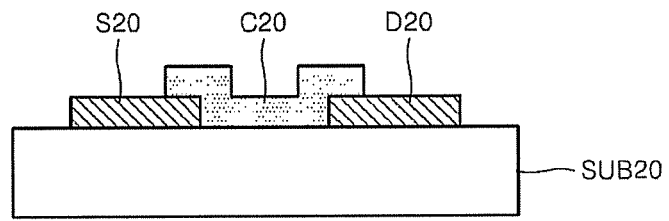
Figure 9C:
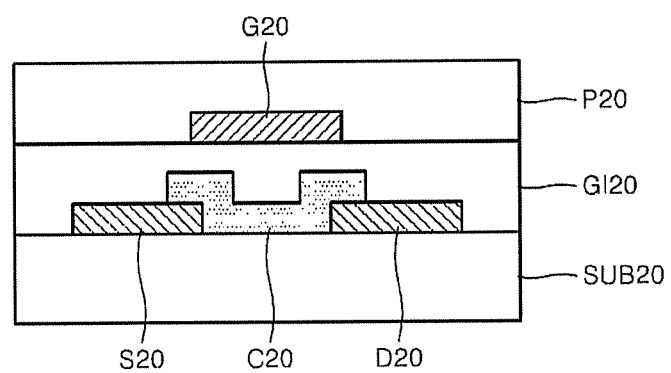

FIGS. 9A through 9C are cross-sectional views of a method of manufacturing a transistor, according to another example embodiment. The method is a method of manufacturing a top gate-type thin film transistor.

Referring to FIG. 9A, a source electrode S20 and a drain electrode D20 that are spaced apart from each other may be formed on a substrate SUB20. Then, a channel semiconductor layer C200 may be formed on the substrate SUB20 so as to cover the source electrode S20 and the drain electrode D20. The channel semiconductor layer C200 may be formed of GaZnON. In this case, the proportion of Ga content to the total content of Ga and Zn of the channel semiconductor layer C200 may be about 0.5 to about 4.5 at %, for example, about 1 to about 3 at %. The Ga content of the channel semiconductor layer C200 may be about 0.25 to about 2.25 at %, for example, about 0.5 to about 1.5 at %. A forming method and the thickness of the channel semiconductor layer C200 may be the same as those of the channel semiconductor layer C100 of FIG. 8B.

As shown in FIG. 9B, a channel layer C20 may be formed by patterning the channel semiconductor layer C200. The channel layer C20 may be formed so as to connect the source electrode S20 and the drain electrode D20 to each other.

Referring to FIG. 9C, a gate insulating layer GI20 may be formed to cover the channel layer C20, the source electrode S20, and the drain electrode D20. The gate insulating layer GI20 may be formed of the same or similar material as the gate insulating layer GI10 of FIG. 8A. Then, a gate G20 may be formed on the gate insulating layer GI20. The gate G20 may be formed over the channel layer C20 to correspond to the channel layer C20. The gate G20 may be formed of the same material as the source electrode S20 and the drain electrode D20 or may be formed of a different material from the source electrode S20 and the drain electrode D20. A passivation layer P20 may be formed on the gate insulating layer GI20 so as to cover the gate G20. The passivation layer P20 may include, for example, a silicon oxide layer, a silicon oxynitride layer, a silicon nitride layer, or an organic insulating layer, or alternatively, may have a stack structure including at least two layers thereof. The transistor manufactured by using the method may be annealed at a given (or alternatively, predetermined) temperature. The annealing may be performed at a temperature of, for example, about 250 to about 350° C.

The method described with reference to FIGS. 9A through 9C is an example of a method of manufacturing the transistor of FIG. 4. The transistor of FIG. 5 may be manufactured by using a modified method of the method described with reference to FIGS. 9A through 9C. The methods of manufacturing the transistors of FIG. 5 may be known by one of ordinary skill in the art and based on the method described with reference to FIGS. 9A through 9C, and thus, are not described.

According to example embodiments, a high-reliability/high-performance transistor having characteristics that are prevented/suppressed from being changed due to light as well as desirable performance (e.g., high mobility) may be more easily manufactured.

It should be understood that example embodiments described therein should be considered in a descriptive sense only and not for purposes of limitation. For example, it would be understood that the transistors of FIGS. 1 through 5 may be changed in various forms. In detail, a channel layer may include a plurality of layers. In this case, one of the layers included in the channel layer may be GaZnON layer. In addition, the transistors of FIGS. 1 through 5 may have a double gate structure. In addition, the method of FIGS. 8A through 8E and the method of FIGS. 9A through 9C may be changed in various forms. It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A transistor comprising:
   a channel layer including GaZuON, wherein a proportion of Ga content to a total content of Ga and Zn of the channel layer is 1 at % to 3 at %;
   a source and a drain configured to contact first and second regions of the channel layer, respectively;
   a gate corresponding to the channel layer; and
   a gate insulating layer between the channel layer and the gate.

2. The transistor of claim 1, wherein the proportion of Ga content to the total content of Ga and Zn of the channel layer is 1.5 at % to 2.5 at %.

3. The transistor of claim 1, wherein the Ga content of the channel layer is about 0.5 to about 1.5 at %.

4. The transistor of claim 1, wherein the channel layer has a thickness of about 10 to about 150 nm.

5. The transistor of claim 1, wherein the channel layer is on the gate.

6. The transistor of claim 5, further comprising:
   an etch stop layer on the channel layer.

7. The transistor of claim 1, wherein the gate is on the channel layer.

8. A flat display apparatus comprising the transistor of claim 1.

9. A method of manufacturing a transistor, the method comprising:
   forming a gate;
   forming a channel layer corresponding to the gate, the channel layer including GaZnON; and
   forming a source and a drain contacting first and second regions of the channel layer, respectively,
   wherein the channel layer is fat wed such that a proportion of Ga content to a total content of Ga and Zn is 1 at % to 3 at %.

10. The method of claim 9, wherein the forming a channel layer includes forming the channel layer by a reactive sputtering method.

11. The method of claim 10, wherein the forming a channel layer includes forming the channel layer using a $Ga_2O_3$ target and a Zn target.

12. The method of claim 10, wherein the forming a channel layer includes forming the channel layer using $O_2$ gas and $N_2$ gas as a reaction gas in the reactive sputtering method.

13. The method of claim 12, wherein the forming the channel layer includes using the $O_2$ gas at a flow rate of about 1 to about 15 sccm, and the N2 gas has a flow rate of about 20 to about 150 sccm.

14. The method of claim 12, wherein the forming the channel layer includes forming the channel layer using argon (Ar) gas for generating plasma.

15. The method of claim 14, wherein the forming the channel layer includes supplying the Ar gas at a flow rate of about 1 to about 50 sccm.

16. The method of claim 10, wherein the forming the channel layer by a reactive sputtering method includes forming the channel layer at a temperature from room temperature to about 100° C.

17. The method of claim 9, wherein the forming a channel layer includes forming the channel layer by a metal organic chemical vapor deposition (MOCVD) method.

18. The method of claim 9, further comprising:
   annealing the transistor at a temperature of about 250 to about 350° C.

19. The method of claim 9, wherein the forming a channel layer includes forming the channel layer on the gate.

20. The method of claim 19, further comprising:
   foxing an etch stop layer on the channel layer.

21. The method of claim 9, wherein the forming a gate includes forming the gate on the channel layer.

22. A channel layer comprising GaZnON, wherein a proportion of Ga content to a total content of Ga and Zn of the channel layer is 1 at % to 3 at %.

23. The channel layer of claim 22, wherein the proportion of Ga content to the total content of Ga and Zn is 1.5 at % to 2.5 at %.

24. The channel layer of claim 22, wherein the Ga content is about 0.5 to about 1.5 at %.

25. The channel layer of claim 22, wherein the channel layer has a thickness of about 10 to about 150 nm.

26. The transistor of claim 1, wherein a threshold voltage variation of the transistor is in a range of −0.79 V to −0.36 V.

27. The method of claim 9, wherein a threshold voltage variation of the transistor is in a range of −0.79 V to −0.36 V.

28. The channel layer of claim 22, wherein a threshold voltage variation of a transistor including the channel layer is in a range of −0.79 V to −0.36 V.

* * * * *

UNITED STATES PATENT AND TRADEMARK OFFICE
CERTIFICATE OF CORRECTION

| | | |
|---|---|---|
| PATENT NO. | : 9,035,294 B2 | Page 1 of 1 |
| APPLICATION NO. | : 13/550752 | |
| DATED | : May 19, 2015 | |
| INVENTOR(S) | : Joon-seok Park et al. | |

It is certified that error appears in the above-identified patent and that said Letters Patent is hereby corrected as shown below:

On the title page item (73), should read:

(73) Assignee: Samsung Electronics Co., Ltd., Gyeonggi-do (KR)

Samsung Display Co., Ltd., Gyeonggi-do (KR)

Signed and Sealed this
Twenty-first Day of June, 2016

Michelle K. Lee
*Director of the United States Patent and Trademark Office*